(12) United States Patent
Daiber et al.

(10) Patent No.: US 9,246,595 B2
(45) Date of Patent: Jan. 26, 2016

(54) SMALL PACKAGED TUNABLE LASER TRANSMITTER

(71) Applicant: Neophotonics Corporation, San Jose, CA (US)

(72) Inventors: Andrew John Daiber, Emerald Hills, CA (US); Frank Lei Ding, Milpitas, CA (US)

(73) Assignee: Neophotonics Corporation, San Jose, CA (US)

( * ) Notice: Subject to any disclaimer, the term of this patent is extended or adjusted under 35 U.S.C. 154(b) by 21 days.

(21) Appl. No.: 14/100,377

(22) Filed: Dec. 9, 2013

(65) Prior Publication Data

US 2015/0162990 A1    Jun. 11, 2015

(51) Int. Cl.
| | |
|---|---|
| *H04B 10/00* | (2013.01) |
| *H04B 10/50* | (2013.01) |
| *H01S 5/14* | (2006.01) |
| *H01S 5/00* | (2006.01) |

(52) U.S. Cl.
CPC ............ *H04B 10/503* (2013.01); *H01S 5/0064* (2013.01); *H01S 5/141* (2013.01)

(58) Field of Classification Search
USPC .................................................. 398/135–139
See application file for complete search history.

(56) References Cited

U.S. PATENT DOCUMENTS

| | | | |
|---|---|---|---|
| 5,109,454 A * | 4/1992 | Okuno et al. | ................... 385/92 |
| 5,319,659 A | 6/1994 | Hohimer | |
| 5,459,747 A | 10/1995 | Takiguchi et al. | |
| 5,579,327 A | 11/1996 | Ohtateme et al. | |
| 5,592,503 A | 1/1997 | Welch et al. | |
| 6,137,814 A | 10/2000 | Brosson et al. | |
| 6,240,312 B1 | 5/2001 | Alfano et al. | |
| 6,295,308 B1 | 9/2001 | Zah | |
| 6,513,993 B1 * | 2/2003 | Nakanishi et al. | .............. 385/92 |
| 6,665,321 B1 | 12/2003 | Sochava et al. | |
| 6,822,981 B2 | 11/2004 | Jacquet | |
| 6,853,654 B2 | 2/2005 | McDonald et al. | |
| 6,917,288 B2 | 7/2005 | Kimmel et al. | |
| 6,941,077 B2 | 9/2005 | Aronson et al. | |
| 6,952,531 B2 | 10/2005 | Aronson et al. | |
| 6,957,021 B2 | 10/2005 | Aronson et al. | |
| 6,990,324 B2 | 1/2006 | Laroia et al. | |
| 7,050,720 B2 | 5/2006 | Aronson et al. | |
| 7,058,310 B2 | 6/2006 | Aronson et al. | |
| 7,079,775 B2 | 7/2006 | Aronson et al. | |

(Continued)

FOREIGN PATENT DOCUMENTS

EP        0687045 A2    12/1995

OTHER PUBLICATIONS

U.S. Appl. No. 13/567,307, filed Aug. 6, 2012, He et al.

(Continued)

*Primary Examiner* — Agustin Bello
(74) *Attorney, Agent, or Firm* — Mueting, Raasch & Gebhardt, P.A.

(57) ABSTRACT

A tunable laser transmitter configured in a small package subassembly coupled to a printed circuit board. The tunable laser transmitter includes a housing with a volume formed by exterior walls. An electrical input interface is positioned at the first end of the housing. A first and a second optical output interface is positioned at the second end of the housing, the first output being configured to transmit a modulated optical beam, and the second output configured to transmit a cw beam to the local oscillator of an external receiver.

18 Claims, 6 Drawing Sheets

(56) References Cited

U.S. PATENT DOCUMENTS

| | | | |
|---|---|---|---|
| 7,149,430 B2 | 12/2006 | Hosking et al. | |
| 7,162,160 B2 | 1/2007 | Aronson et al. | |
| 7,184,668 B2 | 2/2007 | Aronson et al. | |
| 7,200,337 B2 | 4/2007 | Hosking et al. | |
| 7,257,142 B2 | 8/2007 | Sochava et al. | |
| 7,302,186 B2 | 11/2007 | Light et al. | |
| 7,346,278 B2 | 3/2008 | Aronson et al. | |
| 7,710,581 B2* | 5/2010 | Harker | 356/519 |
| 7,771,071 B2 | 8/2010 | Finot et al. | |
| 7,794,157 B2 | 9/2010 | Hudgins et al. | |
| 7,832,944 B2* | 11/2010 | Hosking et al. | 385/92 |
| 7,961,374 B2 | 6/2011 | Finot et al. | |
| 8,186,892 B2* | 5/2012 | Hosking et al. | 385/92 |
| 8,462,823 B2* | 6/2013 | Daiber et al. | 372/20 |
| 8,923,348 B2* | 12/2014 | Liu et al. | 372/20 |
| 2002/0028048 A1* | 3/2002 | Dair et al. | 385/92 |
| 2002/0054614 A1 | 5/2002 | Jin | |
| 2002/0071458 A1* | 6/2002 | Iwafuji | 372/23 |
| 2002/0131466 A1 | 9/2002 | Salvatore et al. | |
| 2003/0053170 A1 | 3/2003 | Levinson et al. | |
| 2003/0086448 A1 | 5/2003 | Deacon | |
| 2003/0095311 A1 | 5/2003 | Liu et al. | |
| 2003/0161570 A1 | 8/2003 | Paniccia | |
| 2004/0071181 A1 | 4/2004 | Huang | |
| 2004/0100686 A1 | 5/2004 | Flanders et al. | |
| 2004/0101016 A1* | 5/2004 | McDonald et al. | 372/97 |
| 2004/0197101 A1 | 10/2004 | Sasser et al. | |
| 2005/0025500 A1 | 2/2005 | Hallemeier et al. | |
| 2005/0074039 A1 | 4/2005 | Kuramachi et al. | |
| 2005/0196111 A1* | 9/2005 | Burdick et al. | 385/92 |
| 2005/0213618 A1 | 9/2005 | Sochava et al. | |
| 2006/0045525 A1 | 3/2006 | Lee et al. | |
| 2006/0072634 A1 | 4/2006 | Daiber | |
| 2007/0092257 A1 | 4/2007 | Smith et al. | |
| 2007/0140690 A1 | 6/2007 | Aronson et al. | |
| 2007/0263713 A1 | 11/2007 | Aronson | |
| 2008/0166131 A1* | 7/2008 | Hudgins et al. | 398/117 |
| 2008/0298810 A1 | 12/2008 | Crosby et al. | |
| 2009/0119686 A1 | 5/2009 | Monroe | |
| 2010/0067854 A1* | 3/2010 | Oki | 385/92 |
| 2010/0322632 A1* | 12/2010 | Way | 398/79 |
| 2011/0032955 A1 | 2/2011 | Daiber | |
| 2011/0033192 A1 | 2/2011 | Daiber et al. | |
| 2011/0062312 A1* | 3/2011 | Hosking et al. | 250/214 A |
| 2011/0110388 A1* | 5/2011 | Baroni et al. | 372/26 |
| 2011/0182305 A1* | 7/2011 | Daiber et al. | 372/20 |
| 2011/0229095 A1* | 9/2011 | Oki | 385/92 |
| 2011/0229096 A1* | 9/2011 | Oki | 385/92 |
| 2011/0249967 A1* | 10/2011 | Bhoja et al. | 398/25 |
| 2011/0255831 A1* | 10/2011 | Oki et al. | 385/78 |
| 2011/0262078 A1* | 10/2011 | Oki et al. | 385/78 |
| 2011/0293279 A1* | 12/2011 | Lam et al. | 398/79 |
| 2011/0299858 A1* | 12/2011 | Mazzini et al. | 398/183 |
| 2012/0045182 A1* | 2/2012 | Ishii et al. | 385/92 |
| 2012/0076505 A1* | 3/2012 | Azemati et al. | 398/201 |
| 2012/0237171 A1* | 9/2012 | Oki | 385/78 |
| 2012/0251116 A1* | 10/2012 | Li et al. | 398/79 |
| 2013/0022360 A1* | 1/2013 | Matsui et al. | 398/116 |
| 2013/0077920 A1* | 3/2013 | Matsue et al. | 385/92 |
| 2013/0177034 A1* | 7/2013 | Liu et al. | 372/20 |
| 2013/0177309 A1* | 7/2013 | El-Ahmadi et al. | 398/25 |
| 2013/0250980 A1* | 9/2013 | Daiber et al. | 372/20 |
| 2013/0250981 A1* | 9/2013 | Busico et al. | 372/20 |
| 2013/0308951 A1* | 11/2013 | Blumenthal et al. | 398/83 |
| 2014/0125427 A1 | 5/2014 | Moon et al. | |
| 2015/0036704 A1* | 2/2015 | Daiber | 372/20 |

OTHER PUBLICATIONS

Akulova et al., "10 Gb/s Mach-Zehnder modulator integrated with widely-tunable sampled grating DBR Laser," Optical Fiber Communication Conference, 2004; 3 pgs.

European Search Report dated Jun. 4, 2014 for European Patent No. 2770590 A1; 3 pgs.

Griffin et al., "Compact, High Power, MQW InP Mach-Zehnder Transmitters with Full-band Tunability for 10 Gb/s DWDM," *ECOC Proceedings*, 2005; 4:903-904.

* cited by examiner

SMALL PACKAGED TUNABLE LASER TRANSMITTER

REFERENCE TO RELATED APPLICATIONS

The present application may be related to U.S. patent application Ser. No. 13/774,309, filed Feb. 22, 2013, U.S. patent application Ser. No. 13/080,519, filed Apr. 5, 2011, now U.S. Pat. No. 8,562,823, provisional application No. 61/444,362, filed Feb. 18, 2011, U.S. patent application Ser. No. 12/722,825, filed Mar. 12, 2010, and U.S. patent application Ser. No. 12/537,026, filed Aug. 6, 2009, each of which applications are incorporated by reference herein in their entirety.

FIELD OF THE INVENTION

The present application is directed to a tunable laser based transmitter and, more particularly, to a small, compact, packaged tunable laser transmitter assembly.

BACKGROUND

Tunable lasers may be packaged as a component of an optical transceiver, or may be used in other applications outside of an optical transceiver. Tunable lasers are generally packaged with other components including an electrical interface and an optical interface.

There is an ever-constant challenge in the industry to reduce the size of tunable laser packages, modulation components, and tunable laser transmitters. The reduction in size may allow lasers and transmitters to be used in a greater number of applications. The reduction in size provides numerous design challenges for the package components to fit within the limited space and also not compromise performance or reliability.

In applications in which tunable lasers and transmitters are a component of an optical transceiver, the tunable lasers and transmitters could be sized for use in a standardized mechanically defined package or form factor. The various form factors set5 forth in "multi-source agreements or MSAs" provide standardized dimensions and electrical input/output interfaces that allow devices from different manufacturers to be used interchangeably. Examples of form factors include, but are not limited to, XENPAK, SFF ("Small Form Factor"), SFP ("Small Form Factor Pluggable"), XFP ("10 Gigabit Small Form Factor Pluggable"), ITLA ("Integrable Tunable Laser Assembly"), and the micro-ITLA ("micro-Integrable Tunable Laser Assembly").

Therefore, while the parent applications have been directed to the tunable laser component, there is also a need for a small, packaged tunable laser transmitter assembly utilizing such a laser component for various applications.

SUMMARY OF THE INVENTION

Objects of the Invention

It is an object of the present disclosure to a small, packaged tunable laser transmitter.

It is another object of the present disclosure to provide small, packaged tunable laser transmitter with an optical output coupler to transmit a portion of the tunable laser beam to an external reference oscillator for use in an 1/Q receiver.

It is an object of the present disclosure to provide a high data rate tunable laser transmitter in a CFP, CFP2, or CFP4 form factor.

It is another object of the present disclosure to provide a means to substantially reduce the size and cost of a small, packaged tunable laser transmitter by an optical layout utilizing two parallel modulators.

Some implementations of the present disclosure may incorporate or implement fewer of the aspects and features noted in the foregoing objects.

Features of the Invention

Summary

The present application is directed to tunable laser transmitters configured in a small package, utilizing a tunable laser in one or another embodiment or package described in any of the parent applications noted above. The tunable lasers may include a rectangular housing, an electrical input interface, an optical output, a tunable semiconductor laser and a focusing lens assembly. The rectangular housing has a volume of less than 0.6 cubic centimeters, with six planar exterior walls including a bottom, a top, opposing first and second ends, and opposing sidewalls. The exterior walls form a hermetically sealed interior space that includes a major axis that extends through the first and second ends. The electrical input interface is positioned at the first end of the housing and aligned with the major axis. The optical output interface is positioned at the second end of the housing and aligned with the major axis.

Inside the transmitter housing, one or two modulators are provided in the package to modulate the continuous wave (CW) optical beam of the laser and produce a modulated optical beam at the optical output interface of the package. The tunable semiconductor laser is positioned in the interior space and operable to emit a laser beam having a selectable wavelength that may be adjusted by an electrical input signal to the laser. An optical train or sequence of optical elements is positioned in the interior space along an optical path of the laser beam to operatively couple the modulated optical output beam to the optical output interface.

Briefly, and in general terms, the present disclosure provides a small, packaged tunable optical transmitter comprising an electrical input interface positioned at the first end of the housing, the electrical input interface configured to receive an information-containing electrical signal; an optical output interface positioned at the second end of the housing, the optical output interface configured to transmit a modulated optical communication beam; a tunable semiconductor laser positioned in the interior space disposed within a rectangular housing having a volume of less than 0.6 cubic centimeters, with six planar exterior walls including a bottom, a top, opposing first and second ends, and opposing sidewalls, the exterior walls forming a hermetically sealed interior space that includes a major axis that extends through the first and second ends and operable to emit a laser beam having a selectable wavelength; and a first and a second semiconductor-based modulators positioned in the interior space along an optical path of the laser beam and, the semiconductor-based modulator configured to impart I and Q modulation respectively to the laser beam corresponding to the information-containing electrical signal received through the electrical input interface.

In another aspect, the present disclosure provides a small, packaged tunable optical transmitter comprising a rectangular housing with six planar exterior walls including a bottom, a top, opposing first and second ends, and opposing sidewalls, the exterior walls forming a hermetically sealed interior space that includes a major axis that extends through the first and second ends; an electrical input interface positioned at the first end of the housing and aligned with the major axis, the electrical input interface configured to receive an information-containing electrical signal; at least one optical output interface positioned at the second end of the housing and aligned with the major axis, the optical output interface configured to transmit an optical communication beam; a tunable semiconductor laser positioned in the interior space and operable to emit a laser beam having a selectable wavelength; and at least one semiconductor-based modulator positioned in the interior space along an optical path of the laser beam and, the semiconductor-based modulator configured to impart modulation to the laser beam corresponding to the information-containing electrical signal received through the electrical input interface.

In another aspect, the present disclosure provides a tunable laser transmitter configured in a small package subassembly coupled to a printed circuit board. The tunable laser transmitter includes a housing with a volume formed by exterior walls. An electrical input interface is positioned at the first end of the housing. A first and a second optical output interface is positioned at the second end of the housing, the first output being configured to transmit a modulated optical beam, and the second output configured to transmit a cw beam to the local oscillator of an external receiver.

In some embodiments, the information-containing RF signal input is from 10 to 25 GHz, or four channels each with a frequency in the range of 10 to 25 GHz.

In another embodiment, the modulator is an 1/Q modulator; i.e. the first modulator corresponds to the I signal, and the second modulator to the Q signal.

In some embodiments, the tunable semiconductor laser is an external cavity laser that includes a tunable filter.

In some embodiments, the tunable filter comprises a Vernier tuning mechanism including respective first and second optical filters having respective sets of transmission peaks having slightly different free spectral ranges and similar finesses, and wherein tuning is performed by shifting the set of transmission peaks of the second optical filter relative to the set of transmission peaks of the first optical filter to align a single transmission peak of each of the first and second sets of transmission peaks.

In some embodiments, the cavity length actuator is disposed between the first and second optical filters of the Vernier tuning mechanism, and further includes an anti-reflection coating on its planar surface.

In some embodiments, a thermoelectric cooler is positioned within the interior space between the bottom of the housing and at least one of the tunable semiconductor laser and the coupling optics.

In some embodiments, the electrical input interface includes a row of pins extending from the housing to enable an electrical connector to be coupled thereto.

In some embodiments, the output of the tunable laser is coupled to the first and second modulators by free space.

In some embodiments, the coupling optics are positioned in the interior space along the optical path between the external cavity laser and the focusing lens assembly, the coupling optics including a pair of coupling lenses and an isolator.

In some embodiments, the first and second semiconductor-based modulators are elongated structures that are positioned in the interior space substantially orthogonal to the outgoing optical path of the laser beam from the tunable laser, In some embodiments, first and second optical reflectors are provided in the optical path of the laser beam from the tunable laser to direct the laser beam to the optical input interface of the first and second semiconductor-based modulators respectively.

In some embodiments, the first and second semiconductor-based modulators are positioned parallel to one another in the interior space, In some embodiments, one of the modulators is positioned offset from the other modulator, i.e. in a non-overlapping manner.

In some embodiments, a one piece third optical reflector is disposed at the output ends of the first and second semiconductor-based modulators so that the modulated output beams from the first and second semiconductor-based modulators are combined to produce a composite output beam.

In some embodiments, an optical second output interface is positioned at the second end of the first housing for coupling to an external reference oscillator for use in the receiver portion of the optical communications system.

In some embodiments, fourth and fifth optical reflectors are provided in the optical path of the laser beam from the tunable laser to direct the laser beam to the optical second output interface.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

DETAILED DESCRIPTION

Figure 1A:
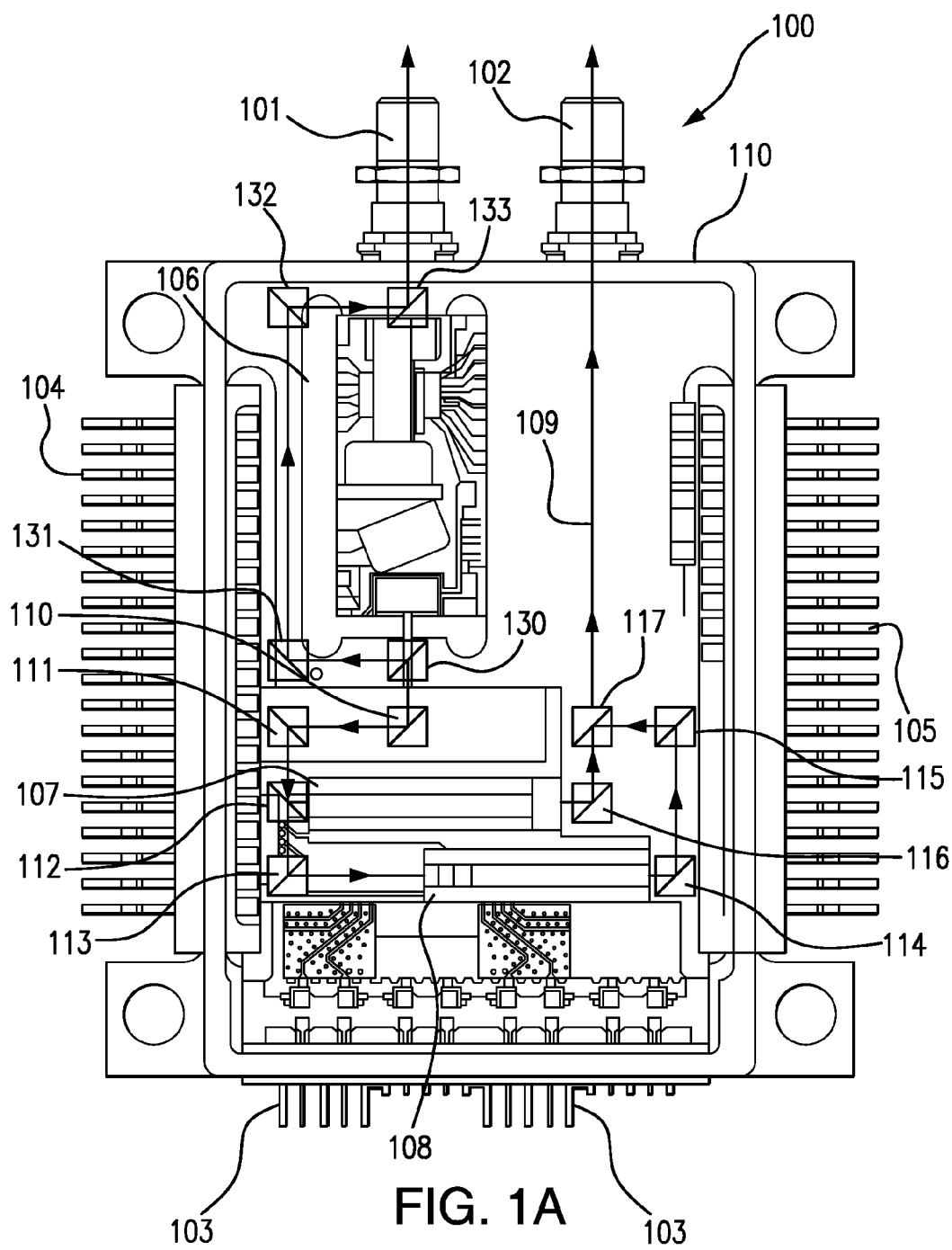
FIG. 1A is a top perspective view of a small, packaged tunable laser transmitter according to one embodiment.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1B:
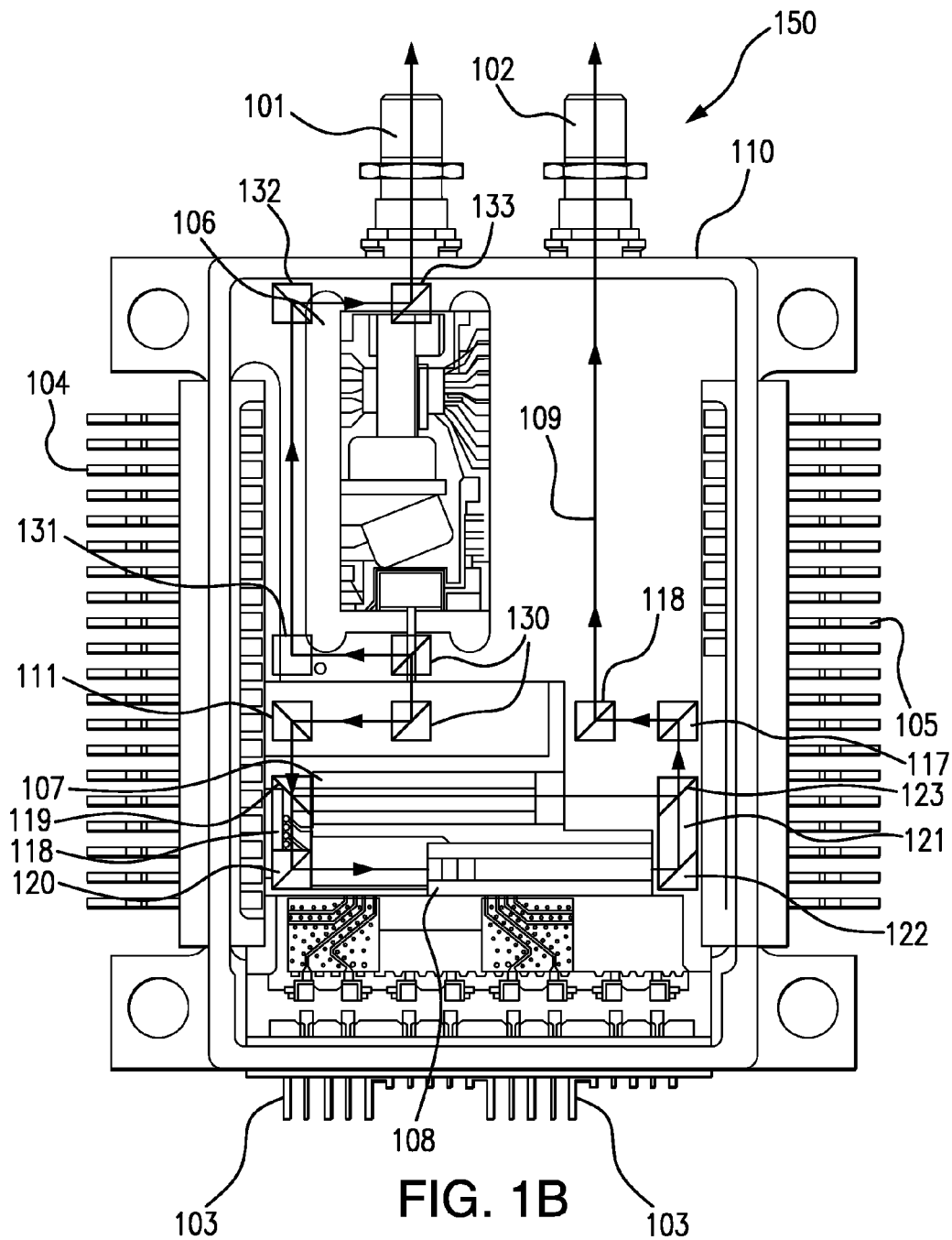
FIG. 1B is a top perspective view of a small, packaged tunable laser transmitter according to one embodiment.
Figure 3:
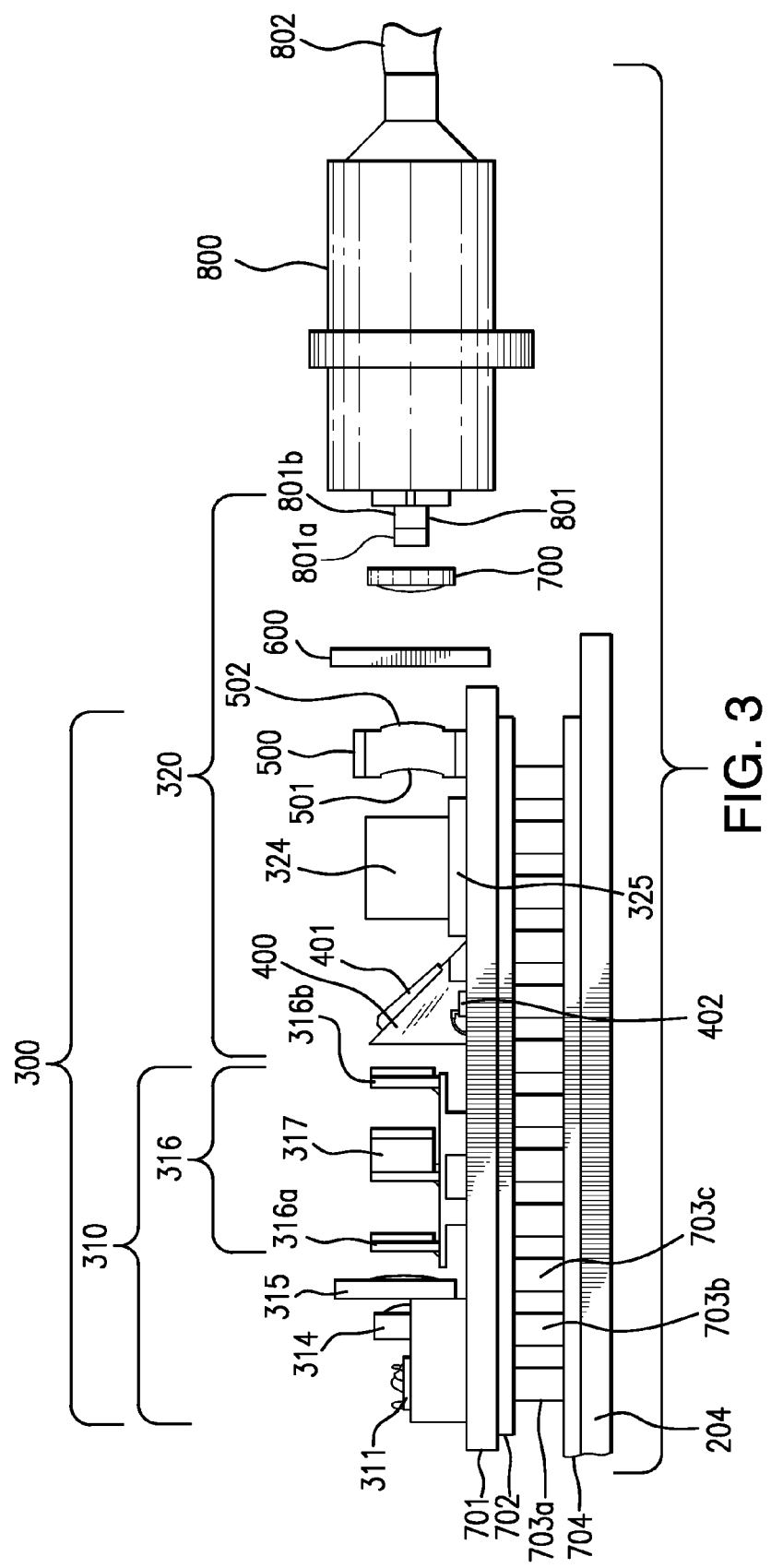
FIG. 3 is a side elevational view of the interior components in the tunable laser transmitter of FIG. 1.
Figure 4:
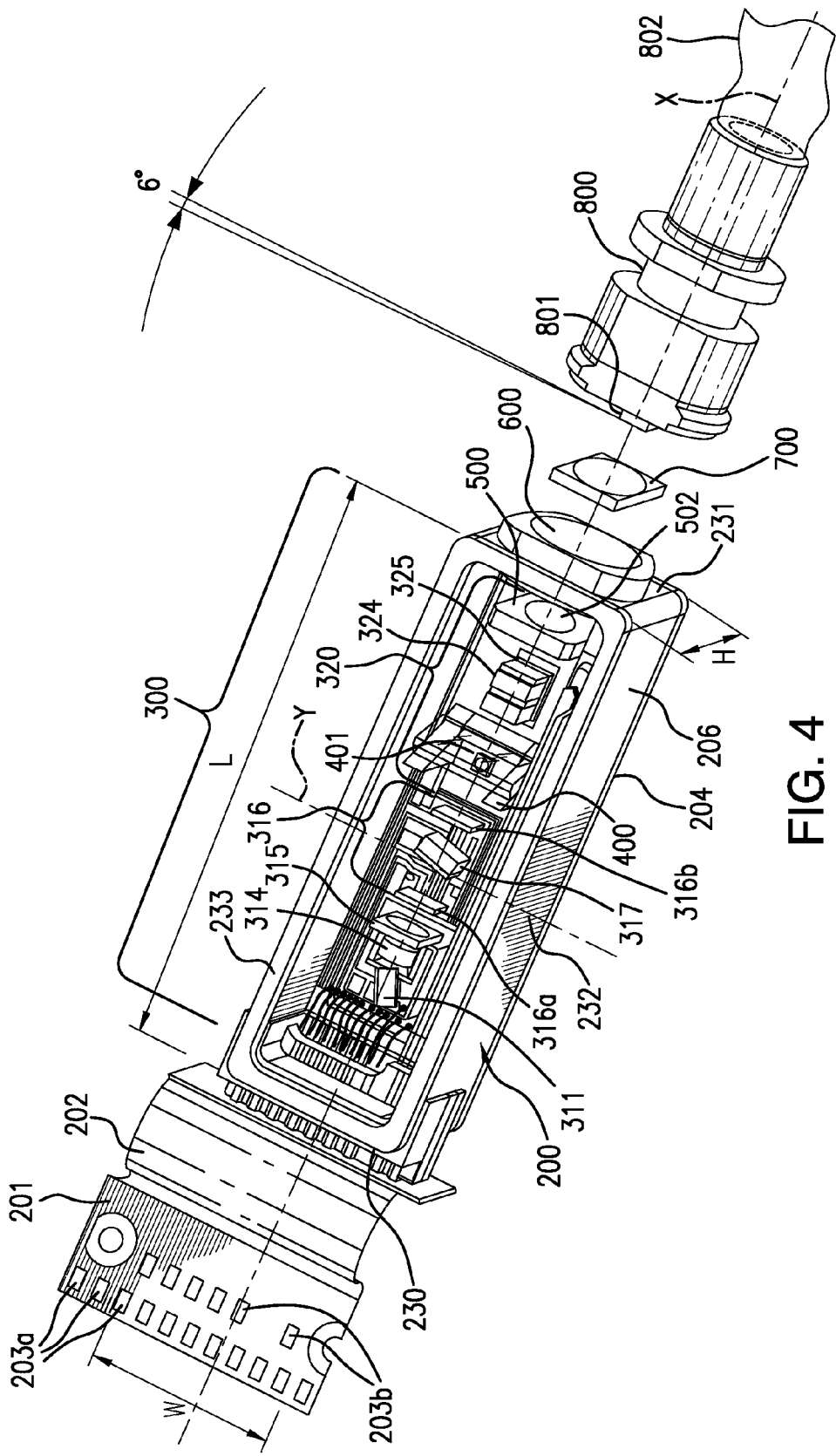
FIG. 4 is a top perspective view of a small, packaged tunable laser transmitter subassembly of FIG. 3 according to one embodiment.

The present application is directed to a small, packaged tunable laser transmitter 100 or 150 as illustrated in FIGS. 1A and 1B respectively, and a tunable laser subassembly for implementation within the transmitter including the embodiments as illustrated in FIGS. 3 and 4. The arrangement of the subcomponents and the optical train path is designed to minimize space and achieve a highly compact configuration.

An electrical input interface is positioned at the first end of the housing. A first and a second optical output interface is positioned at the second end of the housing, FIG. 1A is a top perspective view of a small, packaged tunable laser transmitter 100 according to one embodiment. The device is contained within a housing or package 110, designed for mounting on a printed circuit board, which includes an first optical output port or connector 101 and a second optical output port or connector 102. The first output port 101 is configured to transmit a cw beam from the tunable laser to the local oscillator of an external receiver (not shown), and the second output port 102 is configured to transmit the modulated optical beam to an optical fiber for transmission over an optical network.

The housing 110 also includes electrical pins for an RF modulating signal input 103, and electrical pins or connections 104 and 105 for power and other control and monitoring signals.

The tunable laser subassembly 106, which will be described in detail in connection with FIGS. 3 and 4, is mounted on a printed circuit board inside the housing 110. The output beam from the subassembly 106 is directed to a first beam splitter 130, and then to a reflective optical element 110. The reflected beam from optical element 110 is routed to another reflective optical element 111 to direct the beam to first and second reflective optical elements 112 and 113, and thereafter to modulators 107, 108 respectively for effecting I, Q modulation on the respective incoming optical beams.

The optical path in the embodiment of FIG. 1A utilizes a first beam splitter 112 and a second reflective element 113. The first beam splitter 112 directs a portion of the beam to the first modulator 107, and a second portion of the beam to the second beam splitter 113, which in turn directs the beam to the second modulator 108.

The I/Q modulators are elongated rectangular subassemblies which are arranged parallel to one another, with the one of the modulators 108 being positioned shifted or offset from the other modulator 107 as depicted in FIG. 1A. Such a configuration according to the present disclosure enables a highly compact optical path and transmitter to be assembled.

The output of the first and second modulators 107, 108 is combined to produce a composite beam 109 which is directed to the optical output port 102.

In the embodiment of FIG. 1A, the output of modulators 107, 108 are directed to beam reflectors/splitters 114, 116 respectively, and then downstream to reflectors 115, and 117. The beam from reflector 115 is directed to beam combiner 117, which combines the output beam from the two modulators and aligns the resulting output beam along path 109 towards optical output port 102.

FIG. 1B is a top perspective view of a small, packaged tunable laser transmitter 150 according to second embodiment. Since many of the subassemblies and subcomponents in this embodiment are identical to those in FIG. 1A, and have like reference numerals, their description will not be repeated here in the interest of brevity of the present disclosure.

In the embodiment of FIG. 1B, the output beam from the subassembly 106 is directed to a first beam splitter 130, and then to a reflective optical element 110. The reflected beam from optical element 110 is routed to another reflective optical element 111 which directs the beam to a one piece third optical element 118, which includes a beam splitter 119 disposed at the input end of the first semiconductor-based modulator 107, and a reflective optical element 120 at the input end of the second semiconductor-based modulator 108. The optical element 118 thereby directs a portion of the laser beam from the subassembly 106 to the first and second modulators 107, 108 for implementing I, Q modulation.

The output of the first and second modulators 107, 108 is combined to produce a composite beam 109 which is directed to the optical output port 102.

In the embodiment of FIG. 1B, the output of modulators 107, 108 are directed to a one piece optical reflector 121 disposed at the output ends of the first and second semiconductor-based modulators 107, 108. The one piece optical reflector 121 includes an optical reflector 122 and a beam combiner 123. The optical reflector 122 directs the beam from modulator 108 into the beam combiner 123 so as to combine with the output beam from modulator 107, so that that the modulated output beams from the first and second semiconductor-based modulators 107, 108 are combined to produce a composite output beam and directed to optical reflector 115, and thereafter to optical reflector 124, which directs the composite the output beam along path 109 to optical output 102.

Figure 2A:
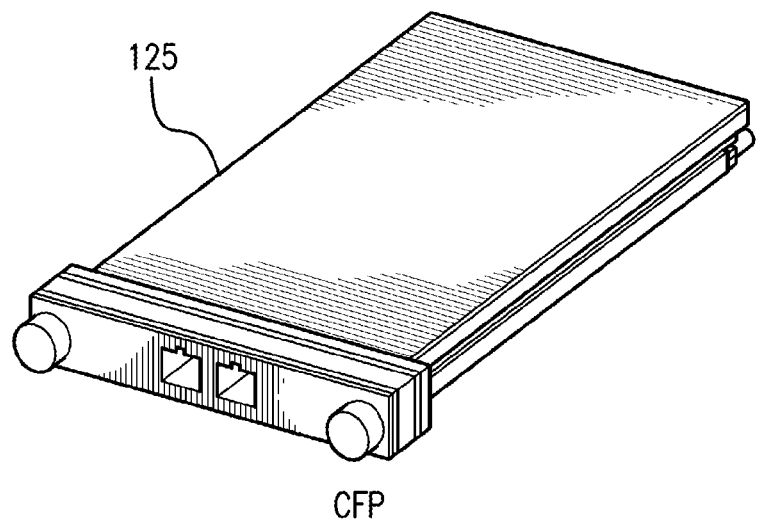
FIG. 2A is a top perspective view of a small, packaged tunable laser transmitter according to another embodiment.

FIG. 2A is a top perspective view of a small, packaged tunable laser transmitter according to another embodiment in a form factor or package conforming to the CFP Multi-Source Agreement (see www.cfp-msa.org).

Figure 2B:
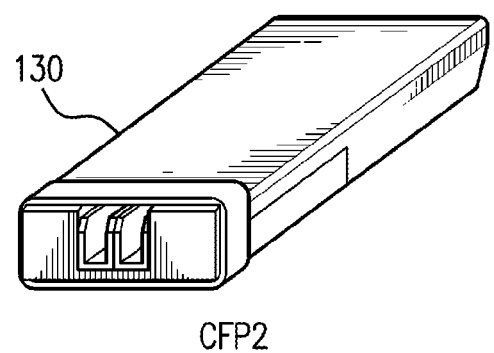
FIG. 2B is a top perspective view of a small, packaged tunable laser transmitter according to another embodiment.

FIG. 2B is a top perspective view of a small, packaged tunable laser transmitter 130 according to another embodiment of the CFP Multi-Source Agreement known as CFP2.

Figure 2C:
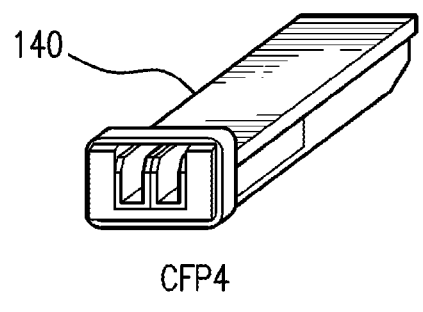
FIG. 2C is a top perspective view of a small, packaged tunable laser transmitter according to another embodiment.

FIG. 2C is a top perspective view of a small, packaged tunable laser transmitter 140 according to another embodiment of the CFP Multi-Source Agreement known as CFP4.

FIG. 3 is a side elevational view of the interior components in the tunable laser subassembly 106 depicted in the transmitter of FIGS. 1A and 1B. The tunable laser is packaged in a housing 200 (shown in FIG. 4) that forms an interior space for housing the laser components 300. The laser components 300 are packaged in housing which is particularly small and compact in size which makes it especially suitable for use in pluggable optical transceivers and various other module configurations or applications. In the present disclosure, the laser subassembly 106 is coupled to a printed circuit board in the housing 110 which includes circuitry for data packet formatting and control of the power and frequency of the laser, and an electrical and mechanical interface for mounting the packaged subassembly on a customer's transmitter platform or card rack assembly.

The laser components 300 generally include an external cavity laser 310 and coupling optics 320. FIG. 3 schematically illustrates the laser components 300 according to one embodiment.

The external cavity laser 310 includes a diode gain chip 311 comprising a Fabry-Perot diode laser with a substantially non-reflective front facet 312 and a highly reflective rear facet 313. The gain chip 311 may also include a bent-waveguide structure. The external cavity laser 310 also includes a collimating lens 314, a steering lens 315, a tunable filter 316, a cavity length actuator 317, and a reflective element 319. Possible implementations of the tunable filter 316 include but are not limited to Bragg gratings, Fabry-Perot etalons, and liquid crystal waveguides. The actuator 317 may use thermal, mechanical, or electro-optical mechanisms to adjust the optical pathlength of the laser cavity. The actuator 317 may also lock the optical pathlength.

The external cavity tunable laser 310 may be configured with the tunable filter 316 being decoupled from the gain chip 311. This configuration results in the tunable filter 316 being very stable and therefore does not require an external wavelength locker as required in Distributed Feedback (DFB) lasers and Distributed Bragg Reflector (DBR) lasers. Other advantages of the external cavity tunable laser 310 over these other lasers are the extremely narrow linewidth and very high side mode suppression ratio.

The coupling optics 320 provide isolation. The coupling optics 320 efficiently couple light from the gain chip 311 to the optical output interface window 600. A total optical magnification of the coupling optics 320 and the external cavity lenses 314, 315 is chosen to correct for the difference between mode field diameters of the gain chip 311. The coupling optics 320 includes an optical isolator 324. The optical isolator 324 may include a two-stage isolator that prevents light reflected from a collimating lens 334 and a steering lens 335 from getting back into the external cavity tunable laser 310. The isolator 324 may also rotate a light polarization by 90 degrees to improve transmission. In one embodiment, the optical path is aligned substantially along the major axis X of the housing 200.

The first subassembly also includes a collimating lens 314 and a steering lens 315 in the path of the beam emitted from the subassembly 311. The collimating lens 314 and the steering lens 315 are both mounted on the same base as the subassembly 311.

The external cavity laser 310 further includes a second subassembly including a tunable filter 316 (including tunable filter elements 316a and 316b), a cavity length actuator 317 disposed between the tunable filter elements 316a and 316b, and a reflective element 319.

Possible implementations of the tunable filter 316 include but are not limited to Bragg gratings, Fabry-Perot etalons, and liquid crystal waveguides. In one embodiment, the tunable filter 316 includes a pair of spaced apart tunable elements or etalons 316a, 316b. The etalons 316a, 316b are Fabry-Perot spaced etalons that are positioned in a parallel configuration. The first etalon 316a includes a thickness measured between opposing faces and a refractive index according to the material from which it is constructed. The second etalon 316b includes a thickness measured between its opposing faces and a refractive index according to the material from which it is constructed. The etalons 316a, 316b may be constructed from the same or different materials, and may include the same or different thicknesses. Etalons 316a, 316b may be constructed from various materials, such as but not limited to silicon and gallium arsenide. One or both etalons 316a, 316b are tunable by a temperature-induced change in their refractive indexes and/or a temperature-induced change in their thickness. In one embodiment, the etalons 316a, 316b are tunable by simultaneous control of both the refractive index and the physical thickness.

In one embodiment, the tunable filter 316 utilizes a Vernier tuning mechanism including respective first and second optical filters 316a, 316b having respective sets of transmission peaks having slightly different free spectral ranges and similar finesses. Tuning is performed by shifting the set of transmission peaks of the second optical filter 316b relative to the set of transmission peaks of first optical filter 316a to align a single transmission peak of each of the first and second sets of transmission peaks.

The actuator 317 may be a block of silicon which is polished and anti-reflection coated, and is disposed between etalons 316a and 316b. In some embodiments the actuator 317 may use thermal, mechanical, or electro-optical mechanisms to adjust the optical pathlength of the laser cavity. In some embodiments the actuator 317 is oriented in the cavity with a seven degree tilt with respect to the optical axis of the beam directed to it from etalon 316a, so that the light circulating in the optical cavity does not reflect back into the cavity regardless of the efficacy of the anti-reflection coating. The actuator 317 may also lock the optical path length.

The external cavity tunable laser 310 may be configured with the tunable filter 316a/316b being decoupled from the gain chip 311. This configuration results in the tunable filter 316a/316b being very stable and therefore does not require an external wavelength locker as required in Distributed Feedback (DFB) lasers and Distributed Bragg Reflector (DBR) lasers. Other advantages of the external cavity tunable laser 310 over these other lasers are the extremely narrow linewidth and very high side mode suppression ratio.

The coupling optics 320 provide isolation and coupling to the optical output interface 801. The coupling optics 320 efficiently couple light from the gain chip 311 to the optical output interface 801. A total optical magnification of the coupling optics 320 and the external cavity lenses 314, 315 is chosen to correct for the difference between mode field diameters of the gain chip 311 and the optical fiber 802.

The coupling optics 320 directly downstream of the etalon 316b includes a wedge shaped support 400 which supports a planar beam splitter 401. The beam splitter 401 is arranged on the support 400 so that its plane is at a 45 degree angle with respect to the incoming beam. A photodiode 402 is mounted on the surface of the base below the beam splitter 401. The beam splitter 401 directs a small portion (e.g. 5%) of the output beam to the photodiode 402, which functions to sense the intensity level of the tunable laser output, so that the user may appropriately control the current to the laser to achieve the desired optical output level or intensity. The remainder of the output beam is directed by a beam splitter to the optical isolator 324.

The positioning of the optical isolator 324 downstream of the beam splitter 401 is one of the features of the embodiment of the present disclosure that distinguishes it from the parent application U.S. patent application Ser. No. 13/080,519, filed Apr. 5, 2011. Experimental data has shown that the positioning of the optical isolator 324 upstream of the beam splitter 401 resulted in a noisy feedback signal, which for many applications and operational conditions was undesirable.

The coupling optics 320 includes an optical isolator 324 disposed directly downstream of the beam splitter 401. The optical isolator 324 may include a two-stage isolator that prevents light reflected from coupling optics 320 from getting back into the external cavity tunable laser 310. The isolator 324 may also rotate a light polarization by 90 degrees to improve transmission. In one embodiment, the optical path is aligned substantially along the major axis X of the housing 200.

In some embodiments, the isolator 324 is mounted on a piezoelectric transducer (PZT) 325. The PZT 325 functions to provide dithering during frequency tuning, which enables locking onto the target frequency more rapidly. The PZT in turn is mounted on the sled or circuit board which has traces thereon that provide the electrical connection to the PZT 325.

The coupling optics 320 directly downstream of the optical isolator 324 is a single ne-piece integral collimating lens 500 including a concave first surface 501 and a convex second surface 502. Downstream from the collimating lens 500 is a window 600 which is attached to the housing 200 and permits the collimated beam to exit the housing 200. Outside of the housing 200 and coupled to the collimated beam is the optical output interface, which includes a fiber focus alignment lens 700 and the optical fiber ferrule 800. In the embodiment depicted, the cladded optical fiber 802 is a "pig-tail" that extends for a relatively short distance to allow coupling to other subassemblies. In another embodiment (not depicted), the window 600 or the alignment lens 700 may be the final downstream components associated with the housing 200, to allow the user to couple an optical fiber directly to the outside of the housing 200 through a pluggable connector or other optical interface.

In some embodiments, as depicted in FIG. 4, the end portion of the ferrule 800 includes a polarizer 801 which has a planar entry end face which is inclined at an angle of about six (6) degrees from a plane which is normal to the incoming central beam from the lens 700. The inclination of the plane is provided to prevent reflections of the incoming beam from the surface of the planar entry end face from going back into the lens 700 and back through the coupling optics 800 into the laser cavity.

A thermoelectric cooler includes first and second plates 702 and 704, respectively, separated by intermediate members 703a, 703b, 703c, etc., that provides a base for supporting the various elements of the tunable laser 100. In one embodiment, the thermoelectric cooler (comprised of elements 702, 703, 704) is positioned between the bottom 204 of the housing 200 and one or more of the laser components 300. The plates 702, 704 may be constructed from a variety of materials, including ceramics. The intermediate members 703a, 703b, etc., each include a first end operatively connected to the first plate 702 and a second end operatively connected to the second plate 704. The intermediate members 703a, 703b, etc. are electrically connected in series by connectors. The intermediate members 703a, 703b, etc., are constructed from semiconductor material that allows for electron flow through the member 703a, 703b, etc. when connected to a DC power source. In use, as the DC power source is activated and a current passes through the series of intermediate members 703a, 703b, etc., the current causes a decrease in temperature at the first plate 702 that absorbs heat from the laser components 300. The heat is transferred through the plate 702 and intermediate members 703a, 703b, etc., into the second plate 704. This heat may then be transferred from the second plate 704, such as to a heat sink.

Likewise, the temperature of the tunable filter 316 and cavity length actuator 317 may be separately controlled from the other laser components 300. A bench 318, which may be composed of a glass, may provide thermal isolation from the thermoelectric cooler 400.

One example of a tunable laser is disclosed in U.S. Pat. No. 7,257,142, herein incorporated by reference. Such patent describes what may be called an "integrated design" in contrast with an arrangement of discrete components such as described in the present disclosure.

Turning to FIG. 4, there is shown a top perspective view of a small, packaged tunable laser subassembly of FIG. 3, according to one embodiment.

The housing 200 includes a generally rectangular body 206 with exterior walls that forms a substantially rectangular shape. The body 206 includes a bottom 204, a cover (not illustrated), first and second ends 230, 231, and opposing sidewalls 232, 233. The cover may be substantially planar and positioned on the top surfaces of the first and second ends 230, 231 and opposing sidewalls 232, 233. In one embodiment, the cover is substantially identical to the bottom 204.

The housing 200 includes a substantially rectangular shape with a width W formed by the opposing sidewalls 232, 233, a length L formed by the first and second ends 230, 231, and a height H that extends between the bottom 204 and top of the sidewalls 232, 233 and ends 230, 231. The housing 200 may include various sizes. In one specific embodiment, the width W is about 5.4 mm, the length L is about 17.1 mm, and the height H is about 5.9 mm. The volume of the interior space formed by the housing 200 may also vary depending upon the application. Exemplary volumes may range from between about 400 $mm^3$ to about 600 $mm^3$. In one specific embodiment, the volume is about 545 $mm^3$. The housing 200 includes an elongated shape with a major axis X extending along the length L through the first and second ends 230, 231, and a minor axis Y perpendicular to the major axis and extending through the opposing sidewalls 232, 233. The housing 200 may be hermetically sealed to protect the laser components 300 from humidity and other environmental conditions.

On the first end 230 of the housing 200 is an electrical interface 202 which in one embodiment is configured as two parallel rows of metal pads 203a and 203b respectively, implemented on a flexible connector strip. Other embodiments may utilize a connector with electrical pins. The electrical interface 202 is configured to receive power and control information-containing electrical signals (which may have an RF frequency from 10 to 25 GHz, or in four channels each in the range of 10 to 25 GHz), or controOI signals such as a signal to adjust the wavelength of the laser, or other characteristics of the output laser beam.

An optical output interface 800 extends outward from the second end 231 of the housing 200. In one embodiment, the optical output interface 800 is an optical fiber ferrule or "pig-tail" aligned with the major axis X of the housing 200. The optical output interface 800 is configured to transmit a continuous wave optical beam that is emitted from the laser components 300 over an optical fiber contained within the interface. The optical output power may be 40 mW or less.

The laser components 300 generally include an external cavity laser and coupling optics 320. The external cavity laser 310 includes a first subassembly 311 including a diode gain chip comprising a Fabry-Perot diode laser with a substantially non-reflective front facet and a highly reflective rear facet. The gain chip may also include a curved-waveguide structure as more particularly described in U.S. patent application Ser. No. 13/567,307, filed Aug. 6, 2012.

Figure 5:
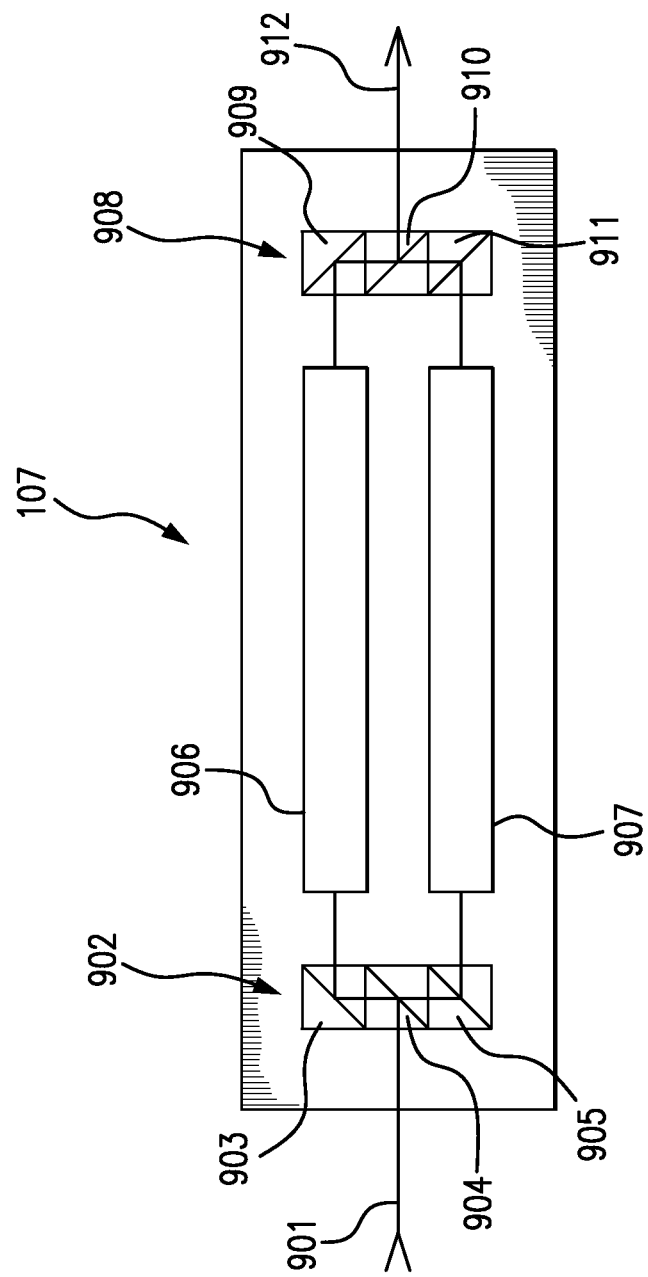
FIG. 5 is a block diagram of a modulator with dual modulation channels on a single substrate according to one embodiment of the present disclosure.

FIG. 5 is a highly simplified detailed view of one implantation of the modulator 107 which is a single InP substrate. In this embodiment, the outgoing light beam from first reflective optical element 112 is represented by line 901 which enters the modulator subassembly and aligns with an optical assembly 902. The optical assembly 902 includes a beam splitter 904 which directs the beam 901 to a first reflector 903 and a second reflector 905. The beam 903 is then directed to a first modulator channel 906, which is an I-modulator, and a second modulator channel 907, which is a a-modulator. This I and Q modulator is implemented in one device 107, and the output of channels 906 and 907 are diverted to optical assembly 908, in which the beam from channel 906 is directed to first reflector 909, the beam from channel 907 is directed to second reflector 911, and the beams from reflectors 909 and 911 are combined in beam combiner 910 to produce a composite output beam 912.

In one embodiment, the two modulators 107 and 108 are similarly structured as described above, in which modulator 107 operates on X polarization, and modulator 108 operates on Y polarization. For a 100 GB/sec system, with current technology, one needs ZI, XQ, YI and YQ channels, which each channel carries a 25 GB/sec data rate. Thus XI and XQ are implemented in modulators 107, and YI and YQ are implemented in modulators 108.

In such an embodiment, the packaged device 100 or 150 is a "DP-QPSK modulator". The DP-QPSK has an IQM for x-polarization and an IQM for y-polarization and a polarization beam combiner (such as optical element 117) to combine these before fiber coupling.

It should be noted that different levels of monolithic integration are possible. One can use a highly integrated DP-QPSK modulators which requires a single set of coupling optics, or two IQM modulator requiring a free space beam splitter/combiner and two coupling optics (the configuration shown and described above), or four separate modulators requiring two stages of beam splitting and four sets of coupling optics followed by two stages of beam combining.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The present invention may be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

The invention claimed is:

1. A small, packaged tunable optical transmitter comprising:
   a first housing extending from a first end to a second end and defining an interior space;
   an electrical input interface positioned at the first end of the first housing, the electrical input interface configured to receive an information-containing electrical signal;
   an optical output interface positioned at the second end of the first housing, the optical output interface configured to transmit a modulated optical communication beam;
   a rectangular second housing disposed in the interior space of the first housing, the second housing having six planar exterior walls including a bottom, a top, opposing first and second ends, and opposing sidewalls, the planar exterior walls forming a hermetically-sealed interior space having a volume of less than 0.6 cubic centimeters;
   a tunable semiconductor laser disposed within the rectangular second housing operable to emit a laser beam along an optical path having a selectable wavelength from the second housing;
   a semiconductor-based modulator positioned in the interior space of the first housing outside of the second housing and configured to impart I and Q modulation to the laser beam corresponding to the information-containing electrical signal received through the electrical input interface, wherein the modulator includes first and second discrete semiconductor-based modulators positioned in the interior space of the first housing outside of the second housing, the first discrete semiconductor-based modulator configured to impart X polarization to the laser beam corresponding to the information-containing electrical signal received through the electrical input interface and the second discrete semiconductor-based modulator configured to impart Y polarization to the laser beam corresponding to the information-containing electrical signal received through the electrical input interface, and the first discrete semiconductor-based modulator configured to impart I modulation to the laser beam corresponding to the information-containing electrical signal received through the electrical input interface and the second discrete semiconductor-based modulator configured to impart Q modulation to the laser beam corresponding to the information-containing electrical signal received through the electrical input interface, wherein the first and second semiconductor-based modulators are disposed in elongated housings that are positioned in the interior space of the first housing substantially orthogonal to the optical path of the laser beam from the tunable semiconductor laser; and
   first and second optical reflectors positioned in the interior space of the first housing outside of the second housing to direct the laser beam from the tunable semiconductor laser to the first and second semiconductor-based modulators, respectively.

2. The tunable optical transmitter of claim 1, wherein the tunable semiconductor laser is an external cavity laser that includes a tunable filter that comprises a Vernier tuning mechanism including respective first and second optical filters having respective sets of transmission peaks having slightly different free spectral ranges and similar finesses, and wherein tuning is performed by shifting the set of transmission peaks of the second optical filter relative to the set of transmission peaks of the first optical filter to align a single transmission peak of each of the first and second sets of transmission peaks.

3. The tunable optical transmitter of claim 1, further comprising:
   a base in the interior of the second housing;
   a structure operatively coupled to the base, the structure having a front facet and a substantially non-reflective rear facet optically coupled via a waveguide passing therethrough, the structure further including a gain section to emit a plurality of photons in response to a first electrical input having a facet defining the rear facet of the structure.

4. The tunable optical transmitter of claim 1, further comprising:
   coupling optics within the rectangular second housing; and
   a ferrule coupled to the rectangular second housing having an entry aperture disposed adjacent to the coupling optics, wherein the entry aperture has a planar face which is inclined at an angle of from five to seven degrees from a plane which is normal to the incoming central beam from the coupling optics so as to prevent reflections of the incoming laser beam from the planar face from going back into the coupling optics.

5. The tunable optical transmitter of claim 2, further including a cavity length actuator positioned in the interior space of the second housing along the optical path of the laser beam downstream from the first optical filter and along the optical path of the beam emitted from the first optical filter and functioning to adjust and lock an optical pathlength of the external cavity laser.

6. The tunable optical transmitter of claim 5, wherein the cavity length actuator is a block of silicon having a planar surface tilted with respect to an optical axis defined by the laser beam emitted from the first optical filter to prevent the incoming light from the laser beam from reflecting back into the external cavity laser.

7. The tunable optical transmitter of claim 2, further comprising:
a cavity length actuator disposed in the interior space of the second housing between the first and second optical filters of the Vernier tuning mechanism and defining a planar surface, and
an anti-reflection coating on the planar surface of the cavity length actuator.

8. The tunable optical transmitter of claim 3, further including a thermoelectric cooler positioned within the interior space of the second housing between the bottom of the second housing and the tunable semiconductor laser.

9. The tunable optical transmitter of claim 1, wherein the electrical input interface includes a row of pins extending from the first housing to enable an electrical connector to be coupled thereto.

10. The transmitter of claim 1, wherein the laser beam emitted by the tunable semiconductor laser is coupled to the first and second discrete semiconductor-based modulators by free space.

11. The transmitter of claim 1, further comprising:
coupling optics positioned in the interior space of the second housing along the optical path of the laser beam between the tunable semiconductor laser and the exterior walls of the second housing, the coupling optics including a pair of coupling lenses and an isolator.

12. The transmitter of claim 1, wherein the first and second semiconductor-based modulators are positioned parallel to one another in the interior space of the first housing with the one of the modulators being positioned offset from the other modulator, and wherein the transmitter further comprises a one-piece optical reflector configured to receive the modulated laser beams of the first and second semiconductor-based modulators so that the modulated laser beams from the first and second semiconductor-based modulators are combined to produce a composite output beam.

13. The transmitter of claim 1, further comprising:
a continuous wave optical output interface positioned at the second end of the first housing; and
a plurality of optical reflectors positioned in the first housing outside of the second housing to direct the laser beam from the tunable semiconductor laser to the continuous wave optical output interface.

14. The transmitter of claim 1, wherein the first housing conforms to either the CFP, CFP2 or CFP4 Multi-Source Agreement.

15. A tunable optical transmitter comprising:
a first housing extending from a first end to a second end and defining an interior space;
an electrical input interface configured to receive an information-containing electrical signal positioned at the first end of the first housing;
a modulated output interface configured to transmit a modulated laser beam positioned at the second end of the first housing;
a second housing disposed in the interior space of the first housing defining a hermetically-sealed interior space;
a tunable semiconductor laser disposed within the second housing to emit a laser beam along an optical path having a selectable wavelength from the second housing;
a first semiconductor-based modulator positioned in the interior space of the first housing outside of the second housing to receive the laser beam from the tunable semiconductor laser and configured to impart X polarization and I modulation to the laser beam corresponding to the information-containing electrical signal received through the electrical input interface;
a second semiconductor-based modulator positioned in the interior space of the first housing outside of the second housing to receive the laser beam from the tunable semiconductor laser and configured to impart Y polarization and Q modulation to the laser beam corresponding to the information-containing electrical signal received through the electrical input interface, wherein the first and second semiconductor-based modulators are disposed in elongated housings that are positioned in the interior space of the first housing substantially orthogonal to the optical path of the laser beam from the tunable semiconductor laser; and
first and second optical reflectors in the optical path of the laser beam from the tunable semiconductor laser to direct the laser beam from the tunable semiconductor laser to the first and second semiconductor-based modulators, respectively.

16. The transmitter of claim 15, further comprising:
a continuous wave optical interface positioned at the second end of the first housing; and
a plurality of optical reflectors positioned in the first housing outside of the second housing to direct the laser beam from the tunable semiconductor laser to the continuous wave optical output interface.

17. A tunable optical transmitter comprising:
a first housing extending from a first end to a second end and defining an interior space;
an electrical input interface configured to receive an information-containing electrical signal positioned at the first end of the first housing;
a modulated output interface configured to transmit a modulated laser beam positioned at the second end of the first housing;
a second housing disposed in the interior space of the first housing defining a hermetically-sealed interior space;
a tunable semiconductor laser disposed within the second housing to emit a laser beam along an optical path having a selectable wavelength from the second housing;
a first discrete semiconductor-based modulator positioned in the interior space of the first housing outside of the second housing to receive the laser beam from the tunable semiconductor laser and configured to impart X polarization and I modulation to the laser beam corresponding to the information-containing electrical signal received through the electrical input interface;
a second discrete semiconductor-based modulator positioned in the interior space of the first housing outside of the second housing to receive the laser beam from the tunable semiconductor laser and configured to impart Y polarization and Q modulation to the laser beam corresponding to the information-containing electrical signal received through the electrical input interface, wherein the first and second discrete semiconductor-based modulators are positioned parallel to one another in the interior space of the first housing with one of the modulators being positioned offset from the other modulator; and
a one-piece optical reflector configured to receive the modulated laser beams of the first and second semiconductor-based modulators so that the modulated laser beams from the first and second semiconductor-based modulators are combined to produce a composite output beam to be directed to the modulated output interface.

18. The transmitter of claim 17, further comprising:
a continuous wave optical interface positioned at the second end of the first housing; and
a plurality of optical reflectors positioned in the first housing outside of the second housing to direct the laser beam from the tunable semiconductor laser to the continuous wave optical output interface.

\* \* \* \* \*